(12) United States Patent
Wadensweiler

(10) Patent No.: US 6,459,382 B1
(45) Date of Patent: Oct. 1, 2002

(54) OVER CLAMP SENSOR

(75) Inventor: Ralph M. Wadensweiler, Sunnyvale, CA (US)

(73) Assignee: Applied Materials, Inc., Santa Clara, CA (US)

(*) Notice: Subject to any disclaimer, the term of this patent is extended or adjusted under 35 U.S.C. 154(b) by 0 days.

(21) Appl. No.: 09/843,505

(22) Filed: Apr. 26, 2001

(51) Int. Cl.$^7$ .................................................. G08B 21/00
(52) U.S. Cl. .................... 340/686.1; 340/686.2; 340/686.3; 340/686.4; 340/686.5; 340/679; 118/666; 118/725; 118/730
(58) Field of Search ................. 340/686.1, 686.2, 340/686.3, 686.4, 686.5, 679; 118/666, 725, 730

(56) References Cited

U.S. PATENT DOCUMENTS

| 4,339,719 A | * | 7/1982 | Yamada | 340/680 |
|---|---|---|---|---|
| 4,789,292 A | | 12/1988 | Holcomb | |
| 4,996,942 A | * | 3/1991 | DeBoer et al. | 118/666 |
| 5,468,302 A | | 11/1995 | Thietje | |
| 5,902,407 A | * | 5/1999 | DeBoer et al. | 118/725 |
| 6,082,377 A | | 7/2000 | Frey | |

FOREIGN PATENT DOCUMENTS

WO   WO 91/19907   12/1991

* cited by examiner

Primary Examiner—Jeffery Hofsass
Assistant Examiner—Hung Nguyen
(74) Attorney, Agent, or Firm—Dugan & Dugan

(57) ABSTRACT

A substrate support is provided that comprises a sensing system configured to detect when a moveable end effector is in an over clamp position. The sensing system may comprise various sensors such as an inductive sensor, a light emitter and a detector, and a pressure sensor, etc. Use of such an over clamp sensor may prevent substrate damage that results from improper substrate gripping.

17 Claims, 15 Drawing Sheets

US 6,459,382 B1

OVER CLAMP SENSOR

FIELD OF THE INVENTION

The present invention relates generally to a substrate support having an end effector configured to support thin substrates such as semiconductor wafers, compact discs, glass wafers, and the like. More particularly, the present invention relates to detection technology that is used to detect a position of the end effector.

BACKGROUND OF THE INVENTION

Semiconductor substrates are often cleaned within a tank of fluid (or a bath) followed by a rinsing process (e.g., by submerging the substrate in rinsing fluid, or by spraying the substrate with rinsing fluid). A substrate support, such as a spin-rinse-dryer (SRD), is typically used to rinse and to dry a substrate.

The substrate support comprises a base and a plurality of mechanisms that are conventionally known as end effectors or grippers (hereinafter referred to as end effectors). Each end effector is coupled to the base and is configured to clamp a properly positioned substrate in place on the substrate support. In order to allow for substrate insertion and extraction, one or more of the end effectors are moveable so as to move between a clamped position wherein a properly positioned substrate is held in place by the end effectors, and an unclamped position wherein a substrate may be extracted from or received by the substrate support. Typically the end effector is biased toward the center of the base so that in the absence of external actuation the end effector assumes the clamped position. To assume the unclamped position, external actuation is applied such that the end effector moves away from the center of the base.

Occasionally, as the external actuation is removed and the end effector moves from the unclamped position toward the clamped position, the end effector may undesirably travel beyond the clamped position. This undesirable position is conventionally referred to as an "over clamp" position and may occur when a substrate is improperly positioned, or when a substrate is absent.

An improperly positioned substrate may not receive proper processing and may be damaged during rotation of the substrate support or during subsequent transfer therefrom.

Accordingly, there is a need to provide an improved apparatus and method that may detect when the end effector is in the over clamp position.

SUMMARY OF THE INVENTION

An inventive substrate support is provided that comprises a sensing system configured to detect when an end effector is in an over clamp position. Specifically, the inventive substrate support comprises a base and at least one moveable end effector coupled to the base and configured to selectively move between a clamped position wherein a properly positioned substrate is held in place by the end effector, and an unclamped position wherein a substrate may be extracted from or received by the substrate support. In one aspect, the sensing system may have a first part coupled to the moveable end effector and a second part coupled to the substrate support's base. The first part and the second part are positioned such that the sensing system detects when the moveable end effector is in an over clamp position. In a further aspect, the inventive substrate support may be rotatable.

The inventive method comprises providing a base and providing an end effector coupled to the base and configured to selectively move between the clamped position and the unclamped position. The inventive method further comprises detecting when the end effector exhibits an over clamp condition.

The sensing system may comprise various sensors such as an inductive sensor, a through-beam sensor such as a light emitter and a detector, or a pressure sensor, etc. Use of such an over clamp sensor may prevent substrate damage that can result from improper substrate gripping.

Other features and advantages of the present invention will become more fully apparent from the following detailed description of the preferred embodiments, the appended claims and the accompanying drawings.

DETAILED DESCRIPTION OF THE PREFERRED EMBODIMENTS

An inventive substrate support is provided that employs a detection device (e.g., a sensing system) to detect when a moveable end effector exhibits an over clamp position. The sensing system may comprise, for example, an inductive sensor as further described below with reference to FIGS. 1A–C, a light emitter and detector as further described below with reference to FIGS. 2A–C, a reflective based sensor as further described below with reference to FIGS. 3A–C, or a pressure sensor as further described below with reference to FIGS. 4A–D.

The inventive substrate support may be employed within any apparatus that grips a substrate, and may be particularly advantageous when employed within a rotatable substrate support (e.g., a spin-rinse-dryer), whether horizontally or vertically oriented, etc. Exemplary aspects of the inventive end effectors, which employ the sensors mentioned above are described below with reference to close-up views of the inventive substrate support, which show the moveable end effector in the clamped, unclamped, and over-clamp positions. The various aspects of the inventive substrate support comprise substantially the same components, and differ mainly in the type of sensor employed. Although the inventive substrate support is shown vertically oriented in the aspects described below, it will be understood that the invention may work equally well when employed in a horizontal orientation, etc.

Figure 1A:
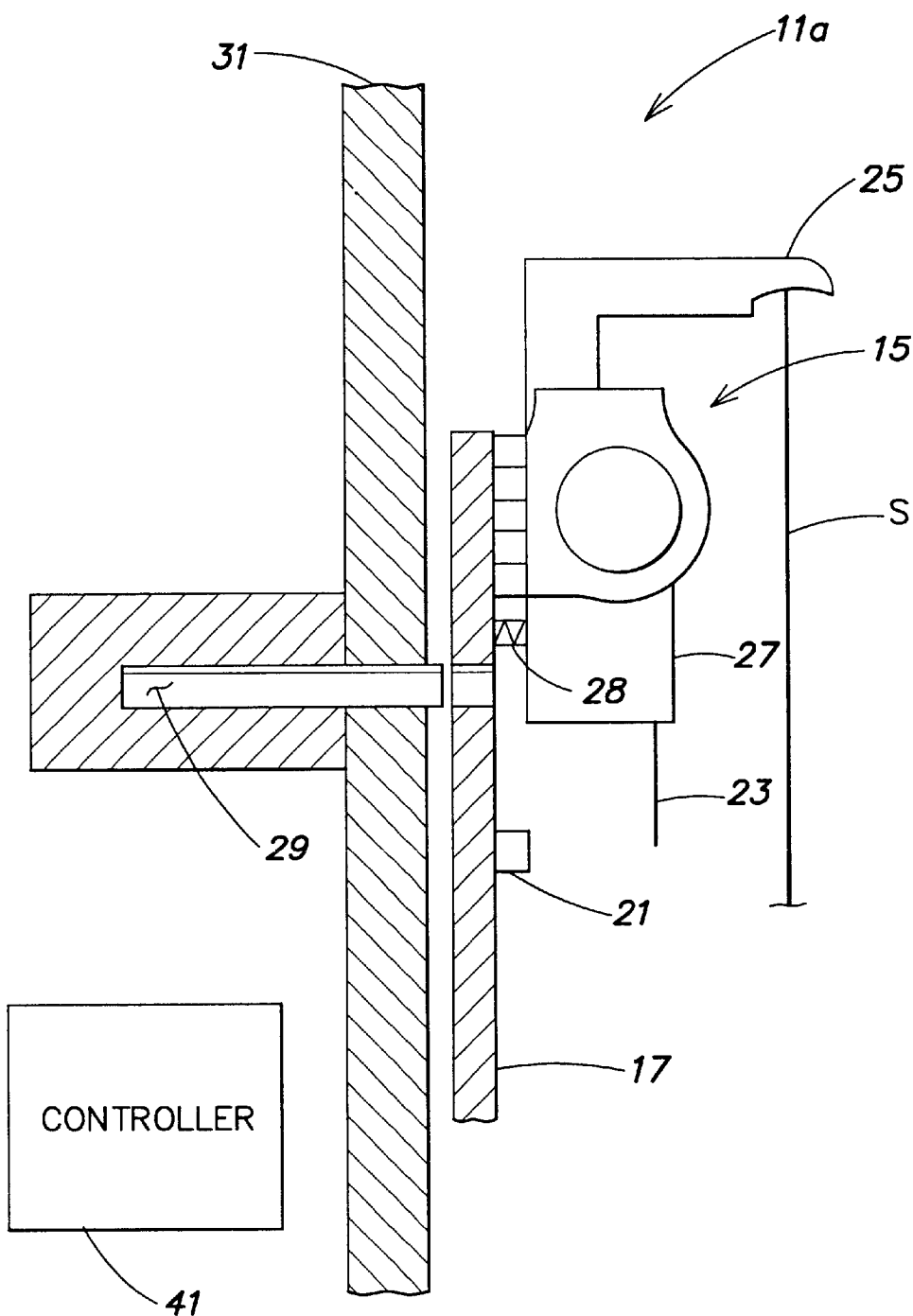
FIGS. 1A–C are close-up views of a first aspect of the inventive substrate support that employs an inductive sensor, and respectively show the moveable end effector in a clamped, unclamped, and in an over clamp position.
Figure 1B:
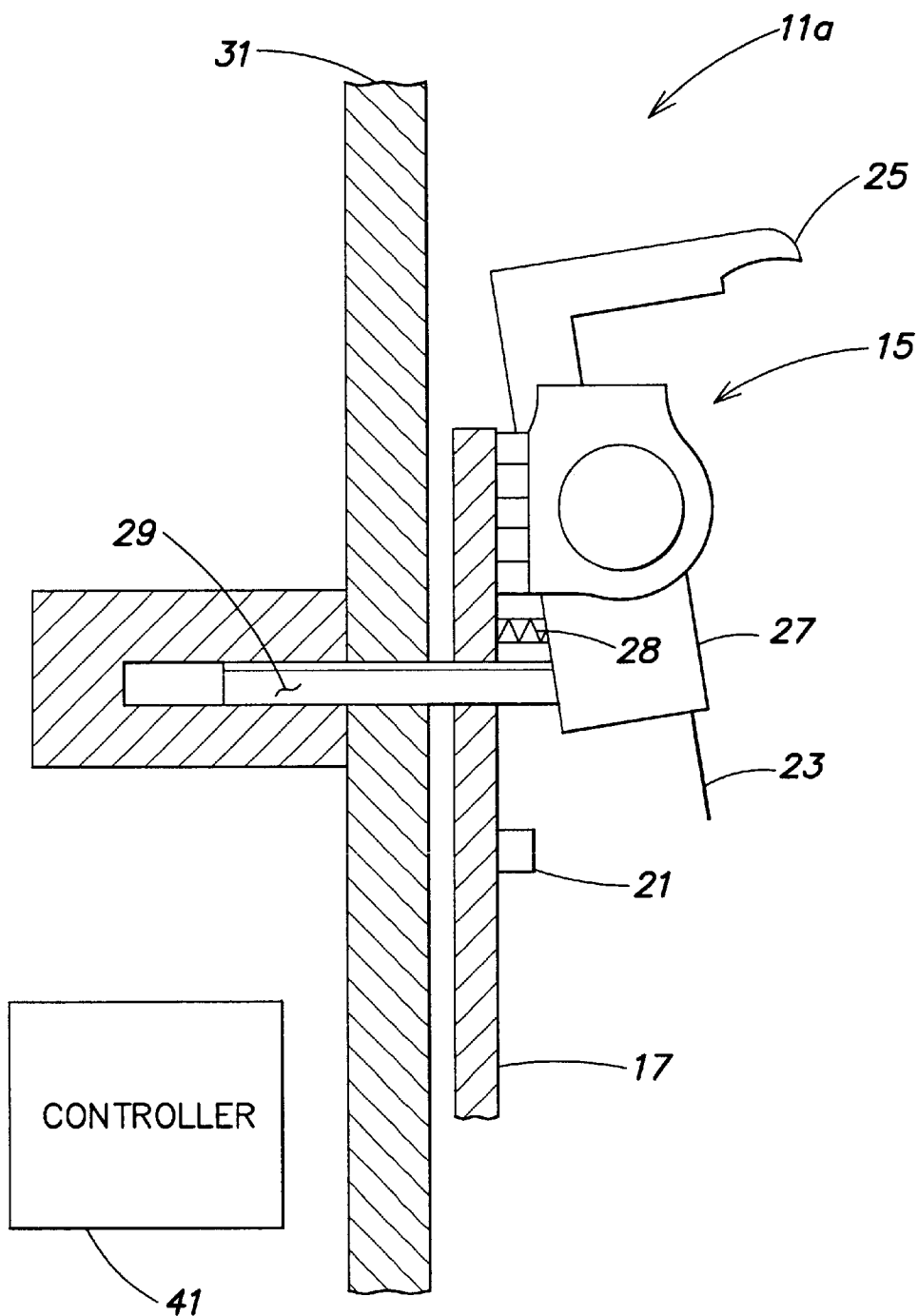
Figure 1C:
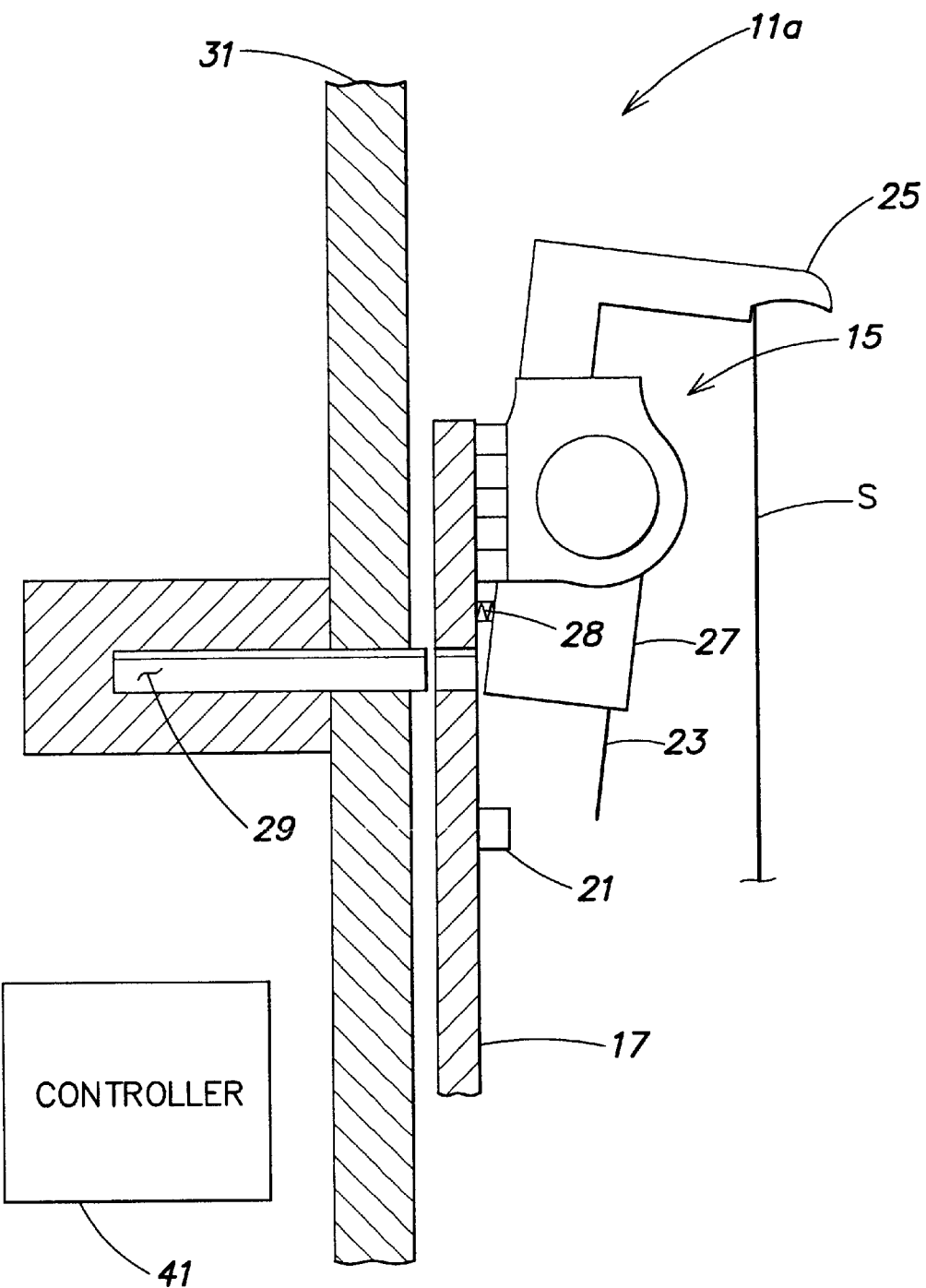

FIGS. 1A–C are close-up views of a first aspect 11a of the inventive substrate support, which employ an inductive sensor. The inventive substrate support 11a comprises a base 17 (e.g., a flywheel) and a moveable end effector 15 coupled to the base 17. The moveable end effector 15 is configured to selectively move (upon actuation) between a clamped position and an unclamped position. In this example, the moveable end effector 15 is biased toward the center of the base 17 so as to assume a clamped position in the absence of outside actuation (described below).

An inductive sensor 21 is shown mounted to the base 17, and a metal flag 23 is shown mounted to the moveable end effector 15 such that the flag 23 moves close enough to the inductive sensor 21 so as to cause a current to flow therein, only when the end effector 15 is in an overclamp position. It should be understood that alternatively, the inductive sensor 21 may be coupled to the moveable end effector 15 and the flag 23 may be coupled to the base 17. The moveable end effector 15 may comprise a finger portion 25 and a base portion 27 as shown in FIGS. 1A–C. In one aspect, the flag 23 may be mounted to the bottom of the base portion 27.

A spring 28 is coupled between the moveable end effector 15 and the substrate support base 17 so as to bias the moveable end effector 15 such that the finger portion 25 is moved toward the center of the substrate support base 17. Thus, in the absence of outside actuation, the moveable end effector 15 assumes the clamped position if a properly positioned substrate is present, and assumes the overclamped position if a substrate either is positioned improperly or is absent. Other mechanisms such as appropriately positioned repulsive or attractive magnets may be employed as alternatives to the spring 28.

A moveable pin 29 (e.g., pneumatically, magnetically, or motor driven) may selectively contact the base portion 27 of the end effector 15 so as to move the moveable end effector 15 between the clamped and unclamped position as described below. The substrate support base 17 is positioned adjacent a housing 31. The pin 29 may slide through an opening in the housing 31 in order to contact and push the base portion 27 of the moveable end effector 15 inward, thereby causing the end effector 15 to assume the unclamped position. It will be understood that the pin actuator described above is merely exemplary and the inventive substrate support 11a may employ any other method to move the end effector 15 between the clamped and unclamped positions.

The inductive sensor 21 may be coupled to a controller 41, which is configured to receive a signal output by the inductive sensor 21 when the flag 23 moves close enough to the inductive sensor 21 so as to cause a current to flow therein. In this manner, the controller 41 may prevent rotation of the inventive substrate support 11a or may otherwise prevent processing when an over clamp position is sensed, as further described below.

Inductive sensors typically comprise a coil (not shown) that generates an electromagnetic field. If a metal target (e.g., the flag 23) is within a predetermined distance from the coil, the metal target will change the magnitude of the coil's electromagnetic field. A detector (not shown) monitors the magnitude of the coil's electromagnetic field, and will output a signal to a controller (e.g., the controller 41) when the change in the magnitude of the coil's electromagnetic field approaches a threshold level. The coil may be shielded to prevent interference from any other metals that may be present. The inductive sensor 21 may be constituted by a conventional device such as model NJ4-12GM40-EO manufactured by Pepperl and Fuchs.

In an exemplary operation as shown in FIG. 1A, the moveable end effector 15 is initially gripping a properly positioned substrate S. Upon actuation, the pin 29 is driven forward and contacts the moveable end effector's base portion 27 to push the base portion 27 forward (away from the inventive substrate support 11a's base 17). Thus, the moveable end effector's finger portion 25 moves backward (toward the inventive substrate support 11a's base 17) to the unclamped position as shown in FIG. 3B. A substrate handler (not shown) removes the substrate S while the pin 29 maintains contact with the base portion 27 of the moveable end effector 15. Thereafter, a substrate handler places another substrate in the inventive substrate support 11a, and an actuator (not shown) gradually retracts the pin 29, thereby allowing the base portion 27 to move backward therewith. Thus, the finger portion 25 of the end effector 15 moves gradually forward, toward the center of the base 17 and toward the substrate S.

As the moveable end effector 15 moves toward the substrate S, the moveable end effector 15 may undesirably assume an over clamp position (e.g., if the substrate S is absent or is improperly positioned) as shown in FIG. 1C. In the over clamp position shown, the moveable end effector's base portion 27 has moved backward beyond a desired position (toward the inventive substrate support's base 17), and the moveable end effector's finger portion 25 has moved forward beyond a desired position (away from the inventive substrate support's base 17) as shown in FIG. 1C. Thus, when the flag 23 moves closer to the base 17, the inductive sensor 21,. which is mounted to the base 17, detects the presence of the flag 23 according to the general technique described above. When the inductive sensor 21 detects the flag 23, appropriate steps may be taken such as interrupting the processing of the substrate, setting off an alarm, etc.

Figure 2A:
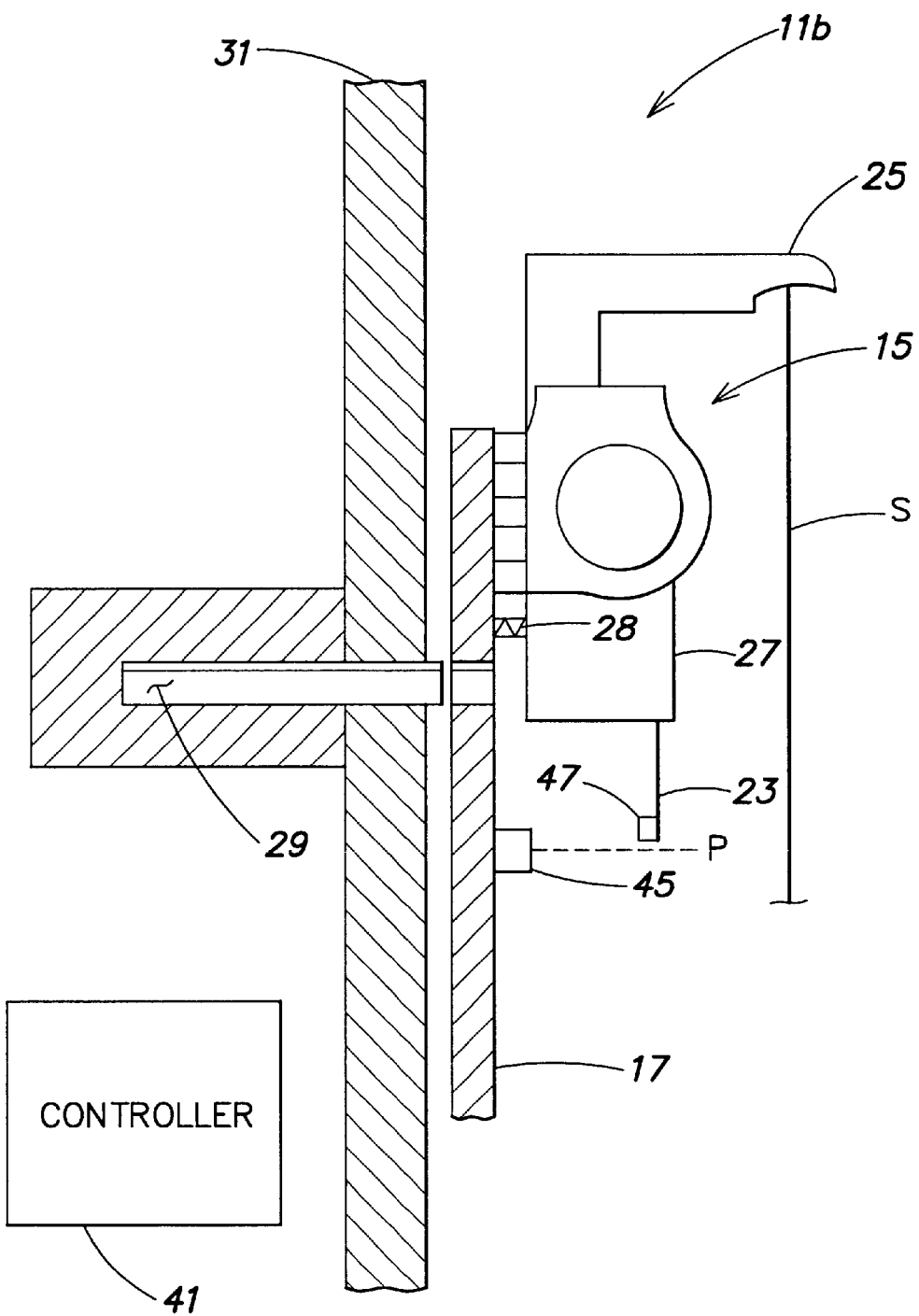
FIGS. 2A–C are close-up views of a second aspect of the inventive substrate support that employs a light emitter and detector, and respectively show the moveable end effector in a clamped, unclamped, and in an over clamp position.
Figure 2B:
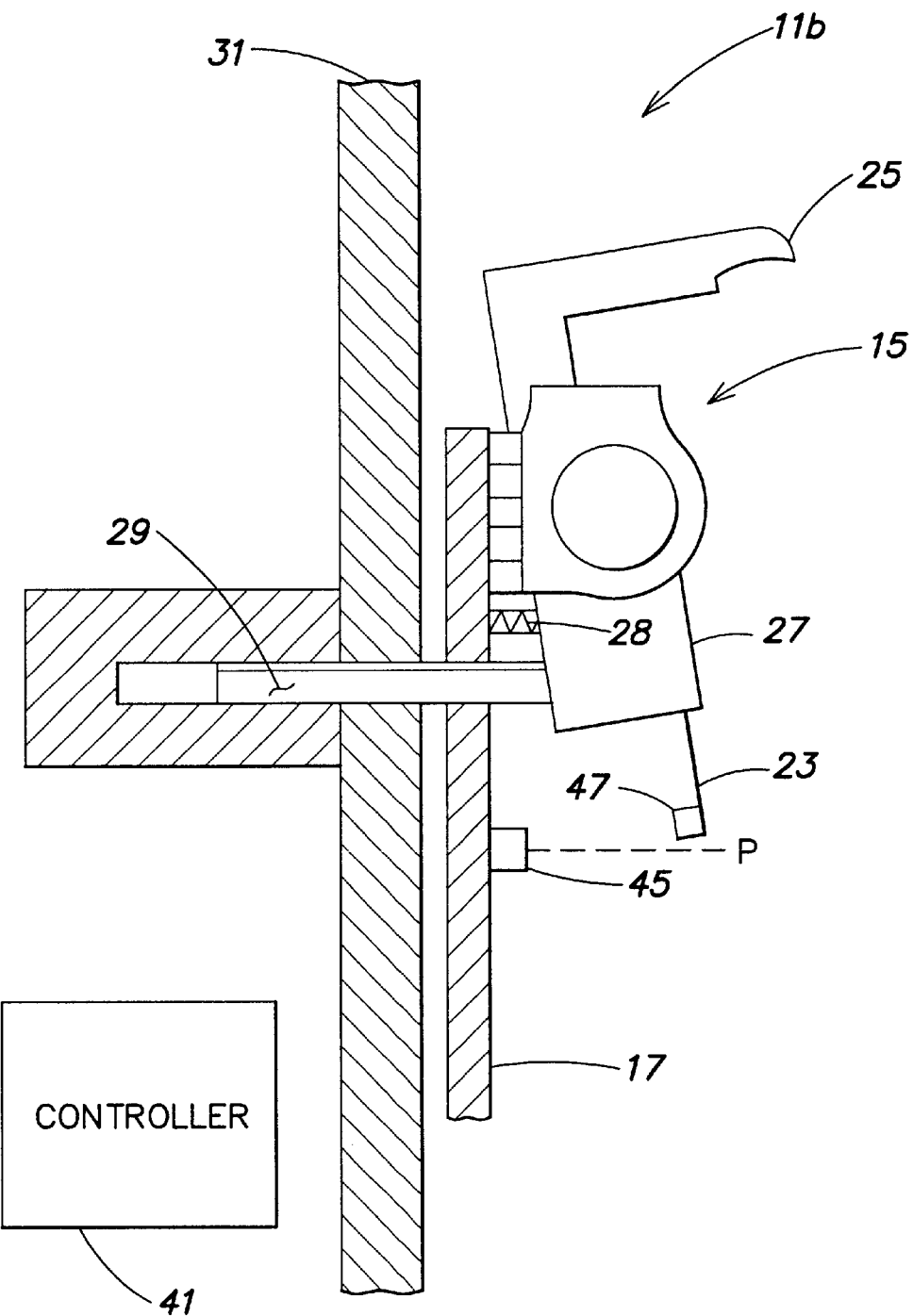
Figure 2C:
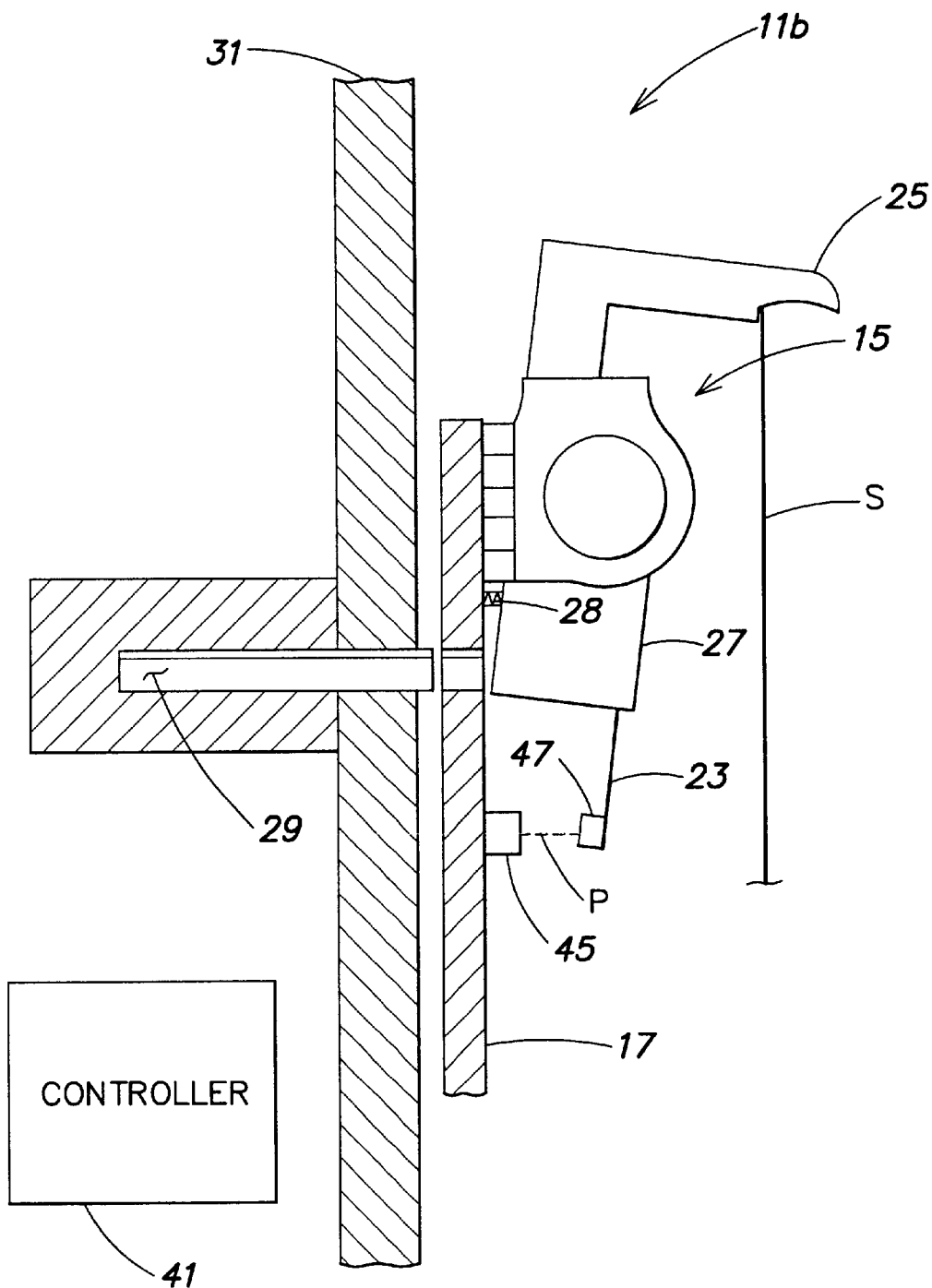

FIGS. 2A–C are close-up views of a second aspect 11b of the inventive substrate support which employ a light emitter and detector rather than the inductive sensor 21 of FIGS. 1A–C. Otherwise, the second aspect 11b of the inventive substrate support may comprise substantially the same components as the first aspect 11a. The light transmitter 45 may comprise a light emitting diode (LED), and the light detector 47 may comprise a photodetector. The light transmitter 45 is shown mounted to the substrate support base 17, and the receiver 47 is shown mounted to the moveable end effector 15 via an optional extended piece such as flag 23. It should be understood that alternatively, the light transmitter 45 may be coupled to the moveable end effector 15 and the receiver 47 may be coupled to the base 17, and in either case may be positioned such that the flag 23 is not needed.

The through-beam sensor may be configured to detect when the flag 23 is within a predetermined distance from the light transmitter 45 by using the following general technique. The light transmitter 45 transmits a beam of light, which defines a signal path P. If the moveable end effector 15 is in the over clamp position, the flag 23 will cross the signal path P, thus allowing the receiver 47 to receive the beam of light transmitted by the light transmitter 45, and subsequently, the through-beam sensor will output a signal to the controller 41.

As shown in FIGS. 2A–B, when the moveable end effector 15 is either gripping a properly positioned substrate S or is in the open position, the flag 23 does not cross the signal path P. Thus, the receiver 47 does not receive the beam of light transmitted by the light transmitter 45.

When the moveable end effector 15 exhibits the over clamp condition as shown in FIG. 2C, the flag 23 is closer to the base 17, and intersects the signal path P, thus allowing the receiver 47 (positioned on flag 23) to receive the beam of light transmitted by the light transmitter 45. The receiver may be sized so as to receive the light beam whenever the moveable end effector is in any of the possible overclamp positions. When the receiver 47 detects the light beam, appropriate steps may be taken such as interrupting the processing of the substrate, setting off an alarm, etc.

Figure 3A:
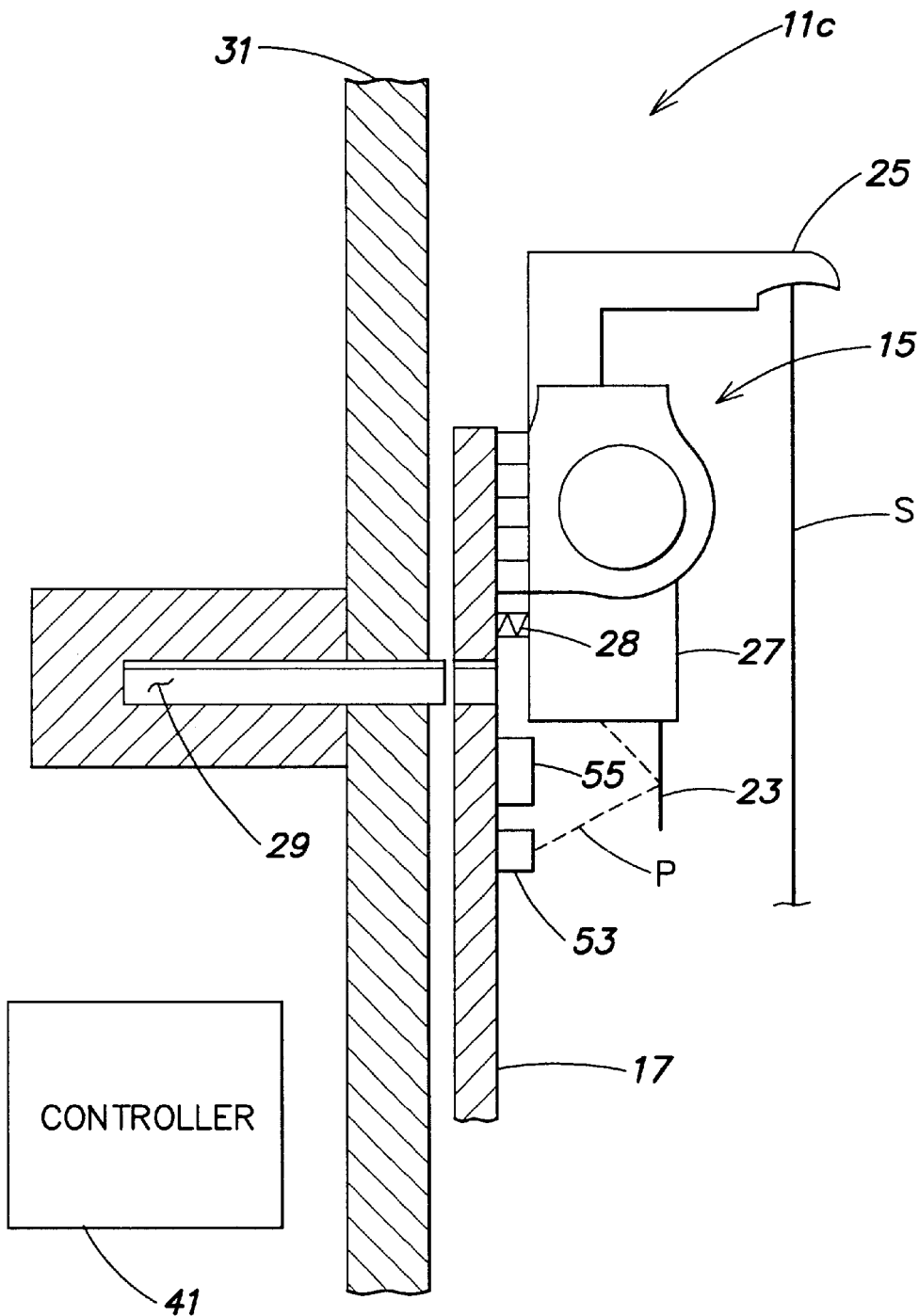
FIGS. 3A–C are close-up views of a third aspect of the inventive substrate support that employs a reflective based sensor, and respectively show the moveable end effector in a clamped, unclamped, and in an over clamp position.
Figure 3B:
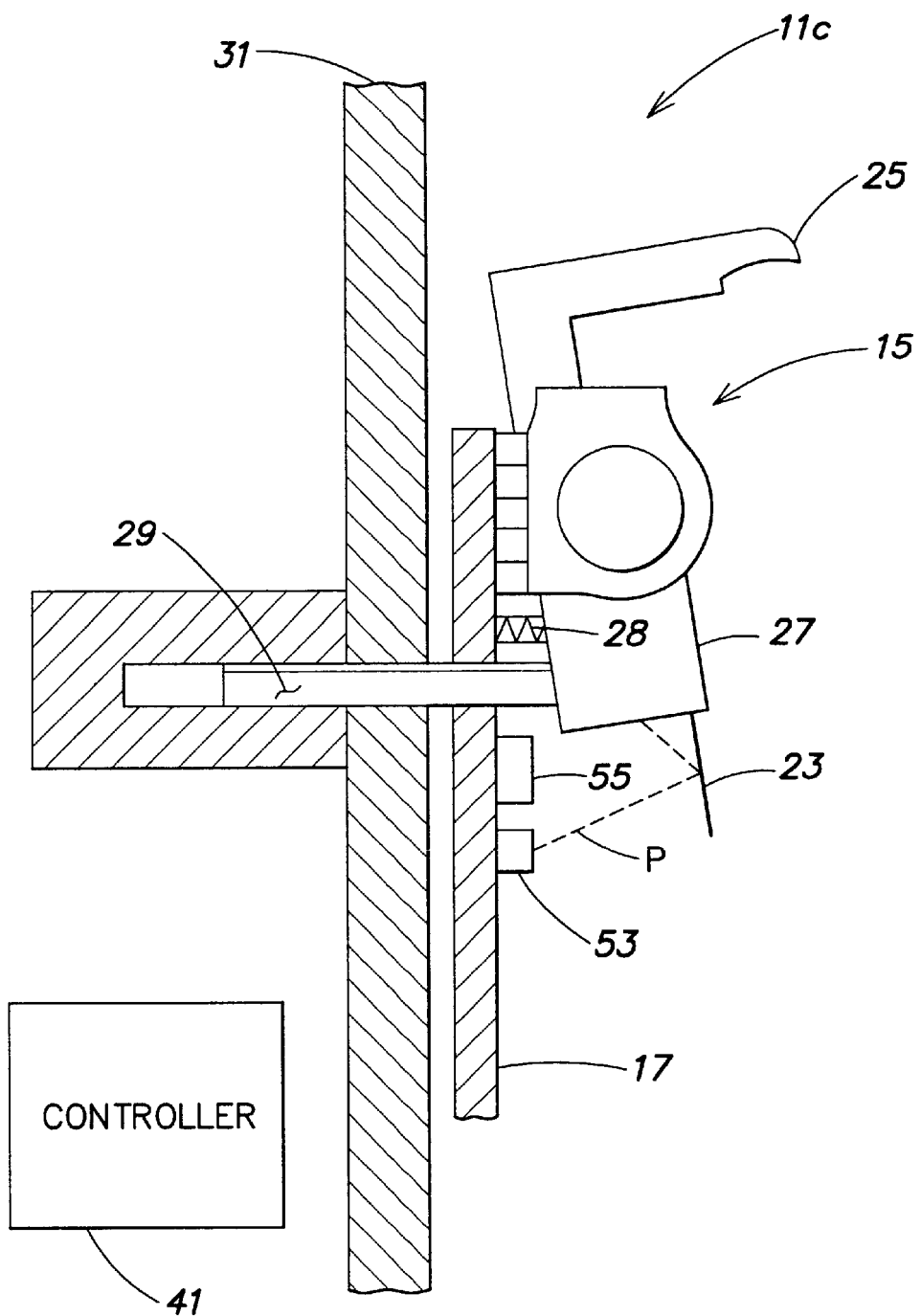
Figure 3C:
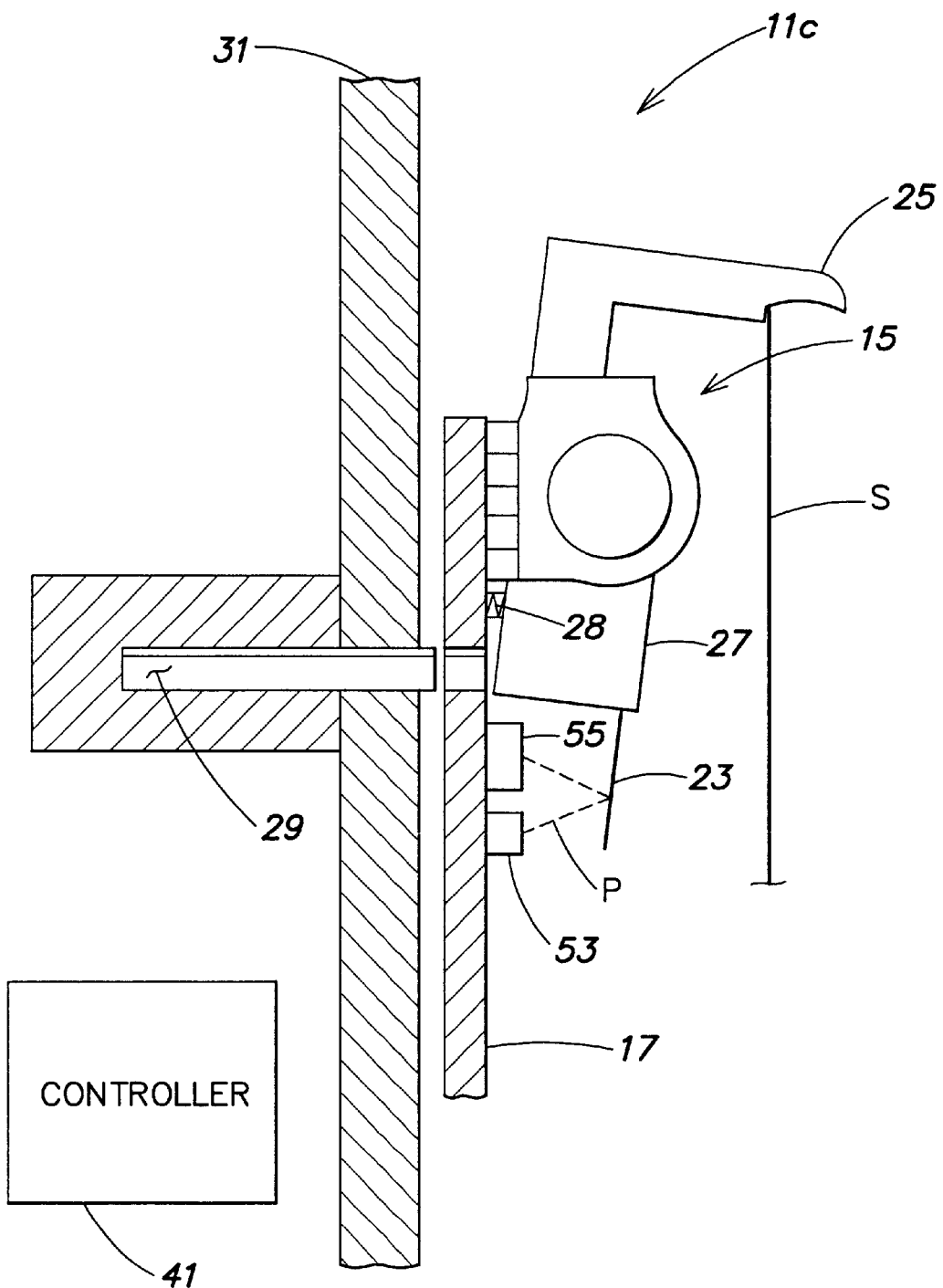

FIGS. 3A–C are close-up views of a third aspect 11c of the inventive substrate support, which employs a reflective based sensor. In the third aspect 11c, a light emitter 53 and a detector 55 are employed. The flag 23 comprises a reflective surface that reflects light transmitted by the light emitter 53 toward the detector 55 when the moveable end effector 15 is in an overclamp position. The light emitter 53 and the detector 55 are shown mounted to the base 17, and the flag 23 is shown mounted to the moveable end effector 15. It will be understood that alternatively, the light emitter 53 and the detector 55 may be coupled to the moveable end effector 15 and the flag 23 may be coupled to the base 17.

The light emitter 53 and the detector 55 are configured to detect when the flag 23 is within a predetermined distance from the light emitter 53 by using the following general technique. The light emitter 53 transmits a beam of light, which defines a signal path P. If the moveable end effector 15 is in the over clamp position, the flag 23 will cross the signal path P such that the light beam impacts the flag 23 with an angle of incidence that causes the light beam to reflect to the detector 55. Accordingly, the detector 55 may be configured so as to receive reflected light when the moveable gripper 15 is an any of the possible overclamp positions, as an overclamp position may vary between a slight overclamp and a significant overclamp. The detector 55 may then output a signal to the controller 41 signaling the overclamp condition, so that the controller 41 may cease processing.

As shown in FIGS. 3A–B, when the moveable end effector 15 is either gripping a properly positioned substrate S or is in the open position, the flag 23 does not intersect the signal path P (or at least does not intersect the signal path P with an angle of incidence that causes the light beam to reflect to the detector 55). Thus, the flag 23 does not reflect the light beam to the detector 55.

If the moveable end effector 15 exhibits the over clamp condition as shown in FIG. 3C, the flag 23 is closer to the base 17, and has intersected the signal path P with an angle of incidence sufficient to reflect the beam of light toward the detector 55. When the detector 55 receives the beam of light transmitted by the light emitter 53, appropriate steps may be taken such as interrupting the processing of the substrate, setting off an alarm, etc.

Figure 4A:
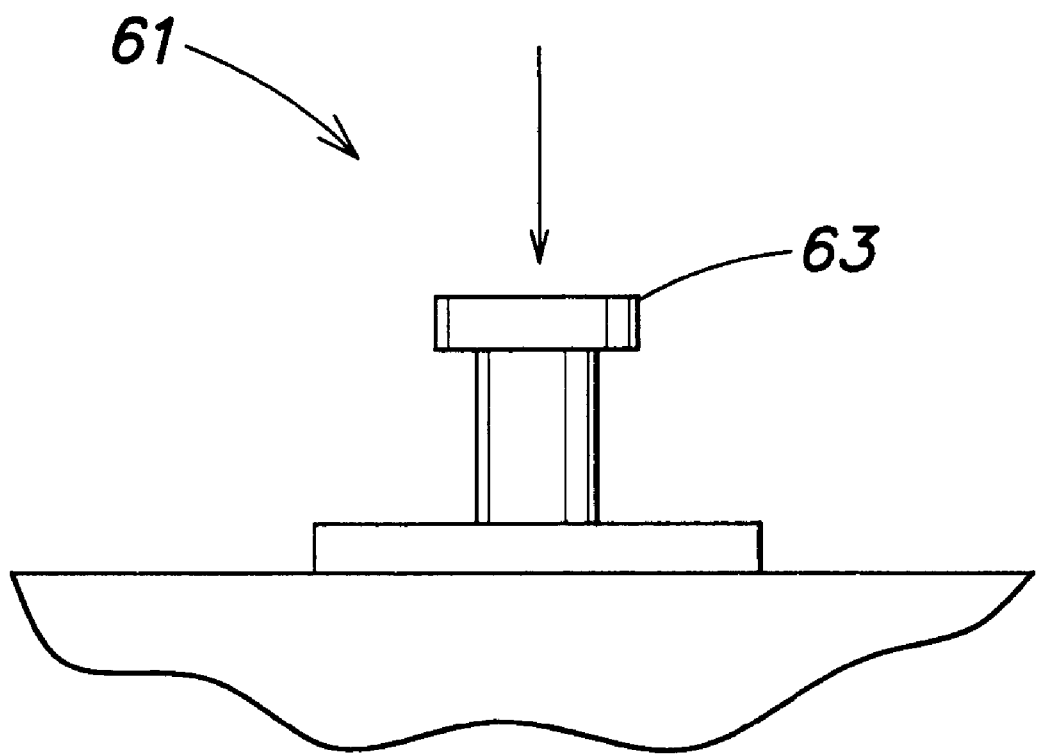
FIG. 4A is a front schematic view of an exemplary pressure sensor.
Figure 4B:
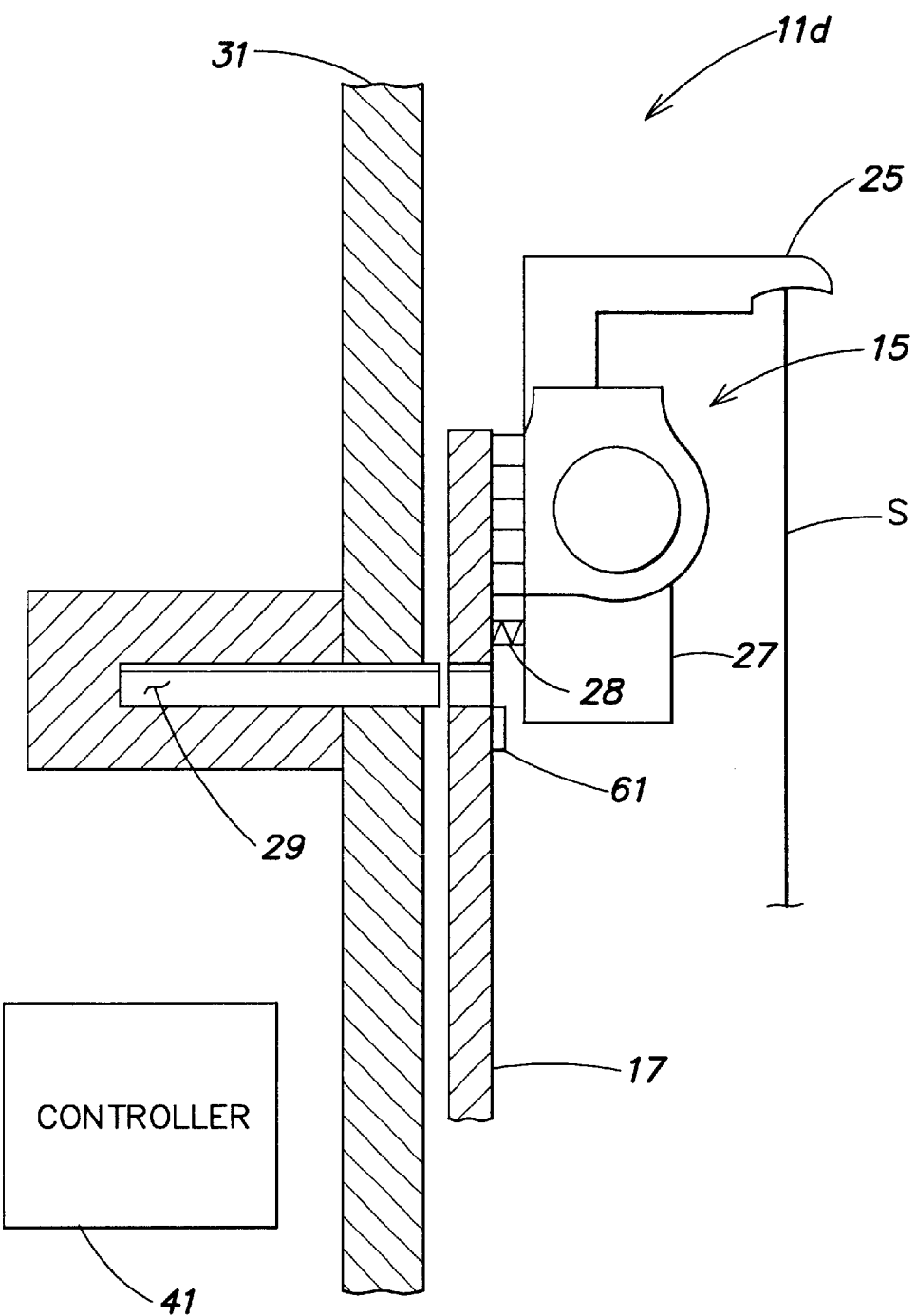
FIGS. 4B–D are close-up views of a fourth aspect of the inventive substrate support that employs the pressure sensor of FIG. 4A, and respectively show the moveable end effector in a clamped, unclamped, and in an over clamp position.
Figure 4C:
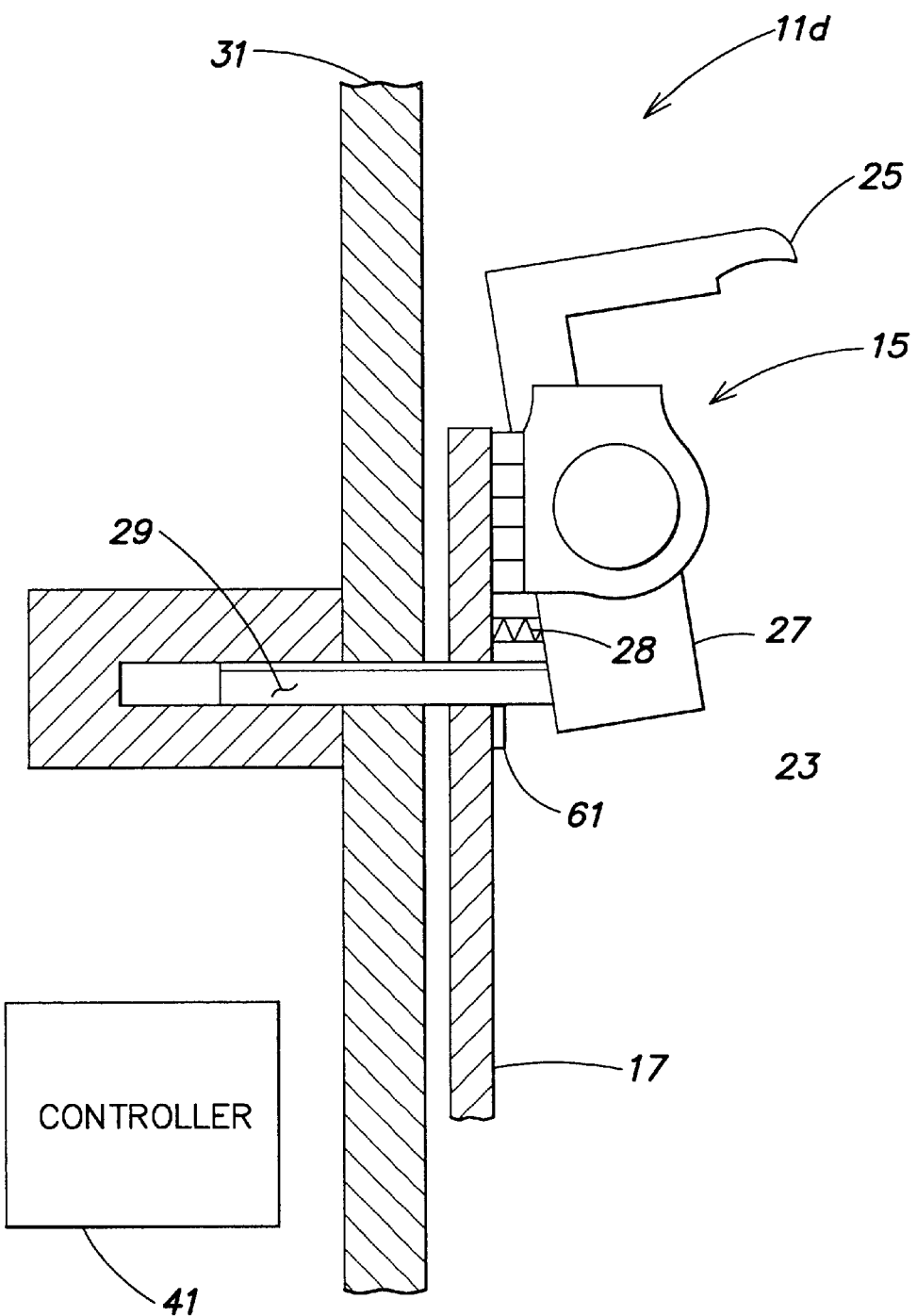
Figure 4D:
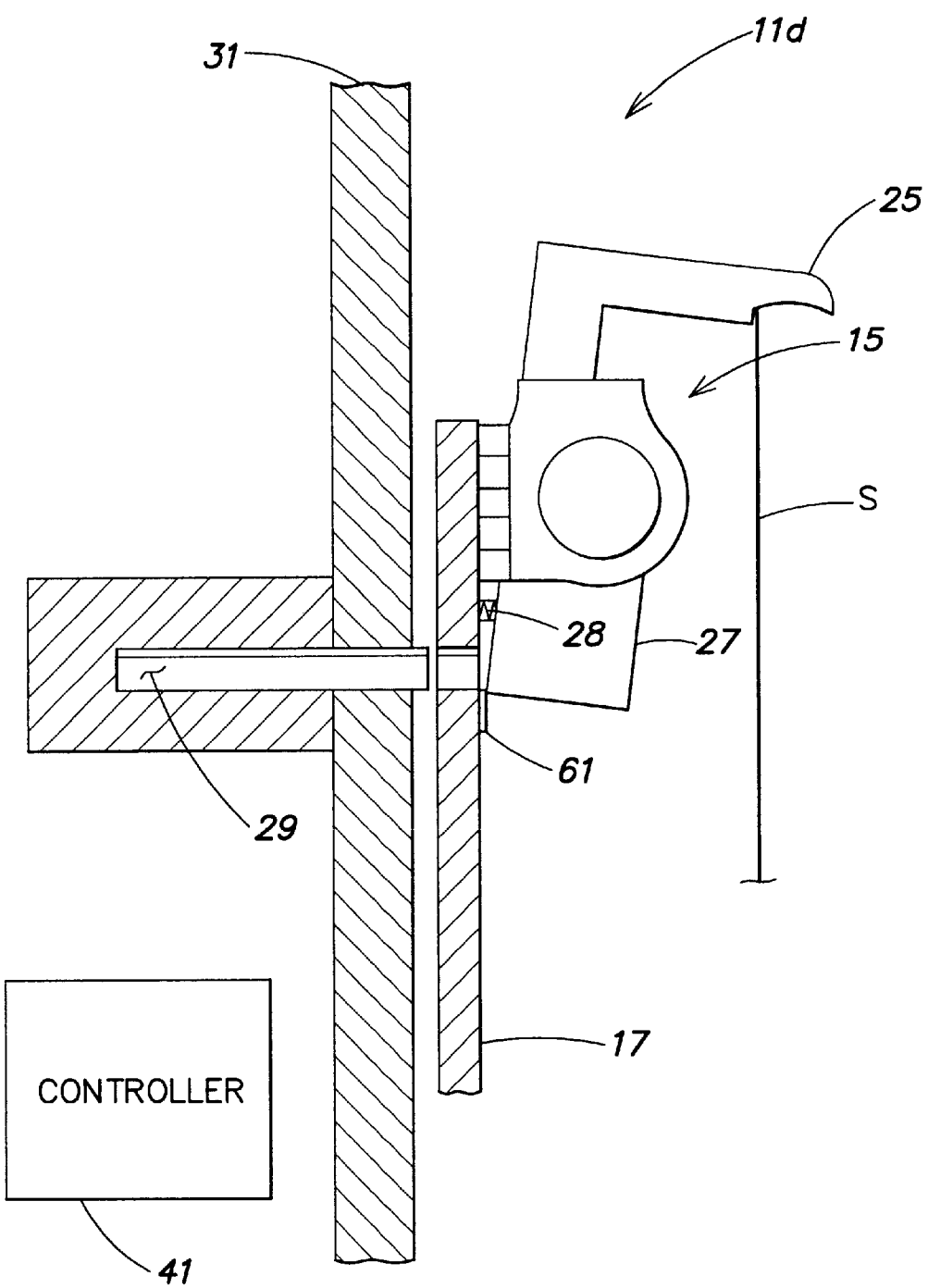

FIG. 4A is a front schematic view of a pressure sensor 61, and FIGS. 4B–D are close-up views of a fourth aspect 11d of the inventive substrate support, which employs the pressure sensor 61 of FIG. 4A. As shown in FIGS. 4B–D, the pressure sensor 61 is shown mounted to the base 17. It should be understood that alternatively, the pressure sensor 61 may be coupled to the moveable end effector 15.

As shown in FIG. 4A, the pressure sensor 61 comprises what is known as a plunger 63 and a circuit (not shown). If an object (e.g., the moveable end effector 15) contacts the plunger 63, the circuit completes according to conventional practice, and a current is thereby generated. A detector (not shown) detects the current and will output a signal to the controller 41.

As shown in FIGS. 4B–C, when the moveable end effector 15 is either gripping a properly positioned substrate S or is in the open position, the moveable end effector 15 does not come into contact with the pressure sensor 61.

When the moveable end effector 15 exhibits the over clamp condition as shown in FIG. 4D, the moveable end effector 15 is closer to the substrate support base 17, and contacts the pressure sensor 61 mounted thereto.

Because the inventive substrate support 11 employs an overclamp sensor, the inventive substrate support 11 may prevent damage to the substrate that may occur, for example, when a substrate support rotates an improperly clamped substrate.

Figure 5:
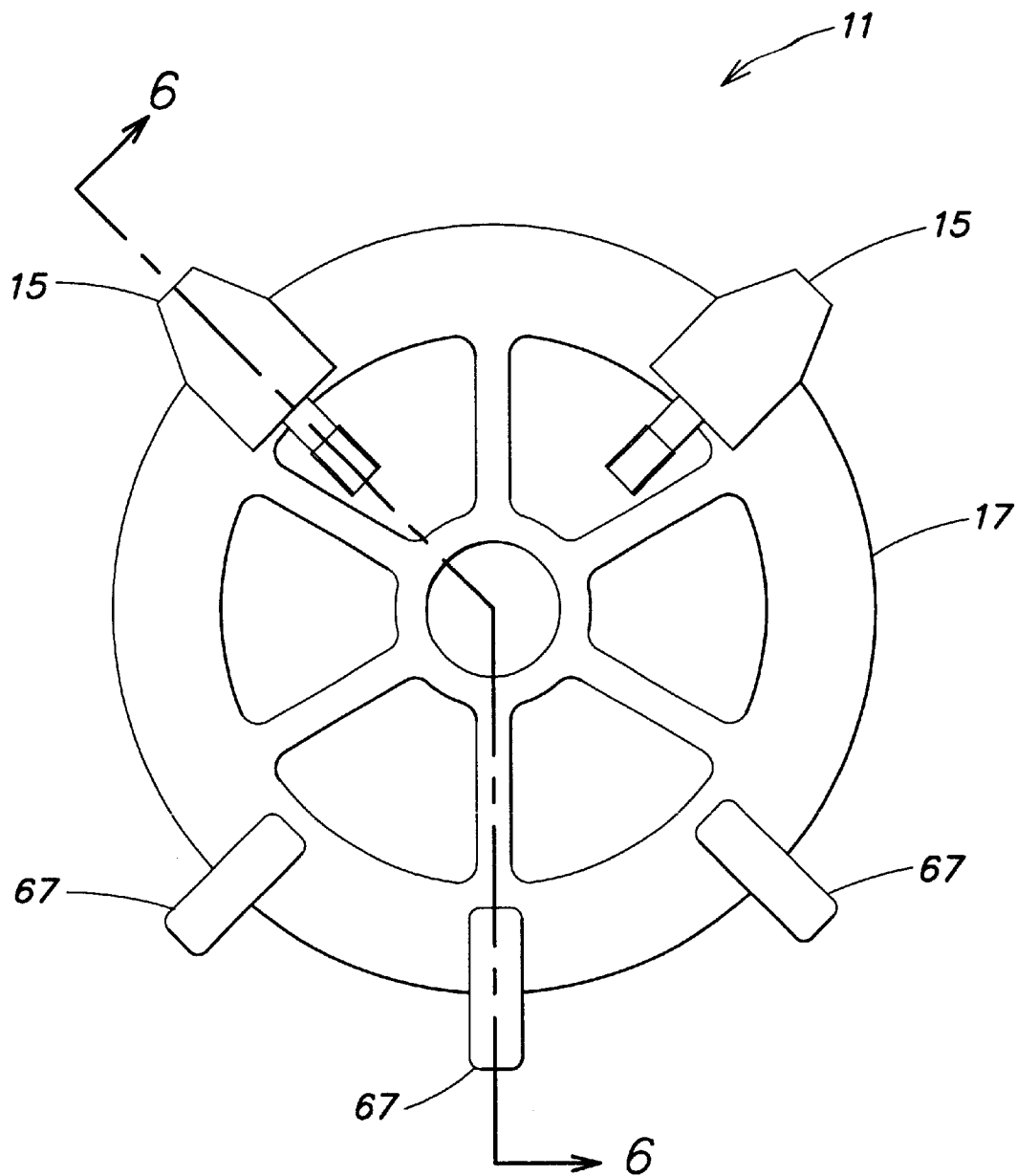
FIG. 5 is a front elevational view, in part, of an inventive substrate support.

FIG. 5 is a front elevational view, in pertinent part, of the inventive substrate support 11 that may employ any of the exemplary sensors described above, and FIG. 6 is a side cross-sectional view of the inventive substrate support 11, taken along line A—A of FIG. 5. For simplicity, a substrate S is shown only in FIG. 6. It will be understood that although a pair of moveable end effectors 15 are shown in FIG. 5, the number of moveable end effectors 15 may vary. When the inventive substrate support is configured for supporting a vertically oriented substrate (as is the inventive substrate support 11 of FIG. 5), the inventive substrate support may further comprise a plurality of fixed end effectors 67 (i.e., end effectors that do not move between the clamped and unclamped positions).

Figure 6:
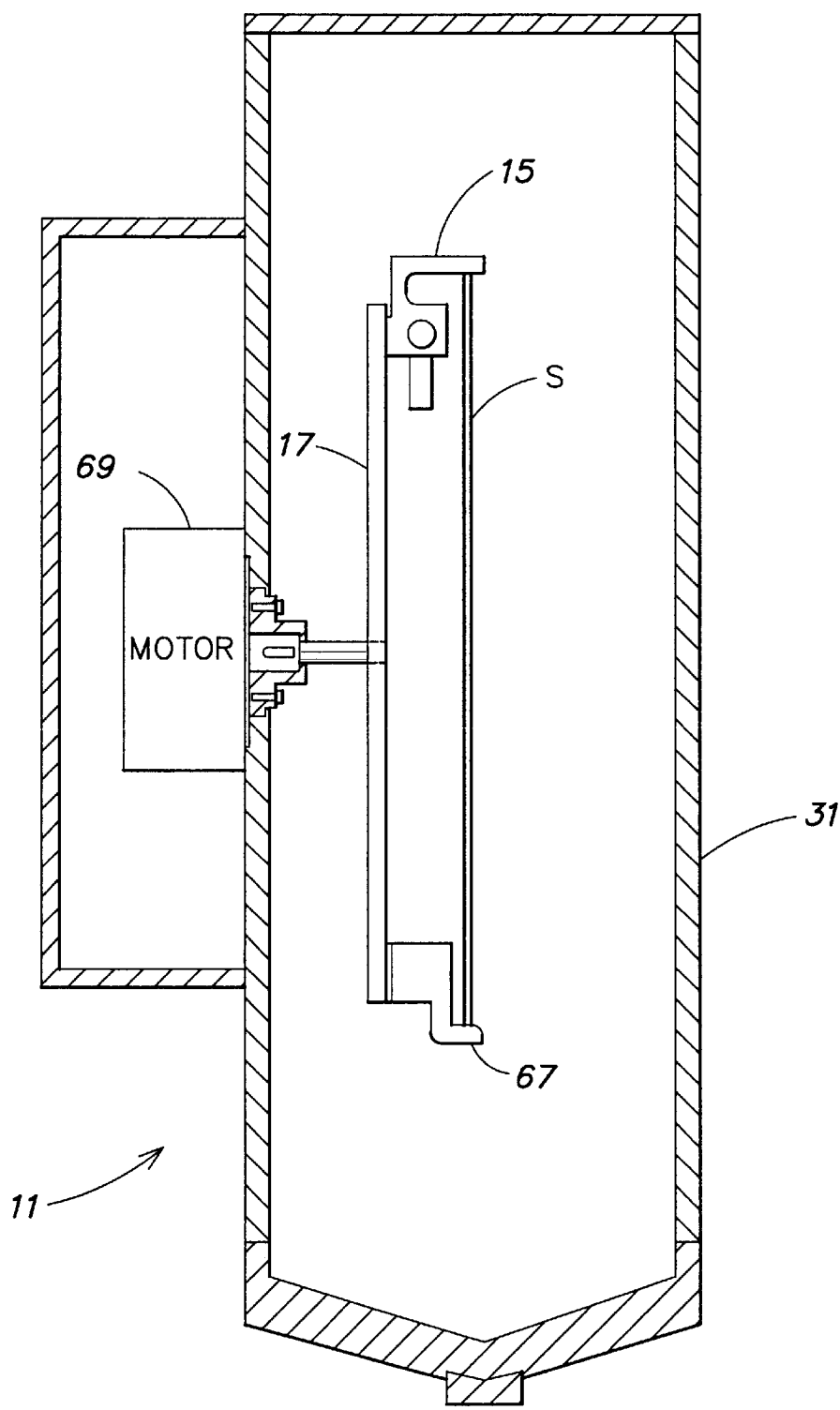
FIG. 6 is a side cross-sectional view of the inventive substrate support of FIG. 5, taken along line A—A.

The inventive substrate support 11 is shown positioned within a housing 31 that has an opening (not shown) for substrate insertion and extraction. As shown in FIG. 6, the base 17 is coupled to a motor 69 via an opening in the backside of the housing 31. The motor 69 is configured to rotate the base 17. The inventive substrate support 11 may be configured for supporting a vertically oriented substrate as described in U.S. patent application Ser. No. 09/544,660, filed Apr. 6, 2000 (AMAT No. 3437/CMP/RKK) the entire disclosure of which is incorporated herein by this reference.

In operation, to receive a substrate such a vertically oriented substrate support rotates to a position wherein the fixed end effectors 67 are spaced along the lower portion of the base 17. The moveable end effectors 15 assume the open position as described above, such that a substrate S may be positioned on the fixed end effectors 67. A substrate handler (not shown) lowers the substrate S and places the substrate S within a groove G of the fixed end effectors 67. The moveable end effectors 15 then rotate toward and gradually contact the substrate S. The base 17 then may rotate while the substrate S is clamped thereto (e.g., while the substrate S is sprayed with rinsing fluid within an SRD). After processing is complete , the moveable end effectors 15 move to the open position, releasing the substrate S as previously described. A substrate handler then may extract the substrate S from the inventive substrate support 11.

In the operation described above, when the moveable end effectors 15 move toward the substrate S, the moveable end effectors 15 may assume the over clamp position (e.g., if the substrate is absent or is improperly positioned). The overclamp position is detected by the inventive substrate support 11 as described above and a controller may stop further processing and/or send an alarm signal. In this manner, substrate damage and improper processing may be avoided.

The foregoing description discloses only the preferred embodiments of the invention, modifications of the above-disclosed apparatus and method which fall within the scope of the invention will be readily apparent to those of ordinary skill in the art. For instance, the sensing system may be applied to other semiconductor processing systems in addition to cleaning/drying systems. Also, other types of sensors may also be employed, such as acoustic sensors. The flag 23 may be omitted, and without the use of the flag 23, the sensors may detect a part of the moveable end effector 15 itself. Although the exemplary moveable end effector 15 is biased toward the center of the base 17, the invention may work equally well with a moveable end effector 15 that alternatively is biased away from the center of the base 17. Similarly, sensors may be designed to detect when the end effector is in the clamped condition, and to signal an overclamp position whenever the end effector is neither actuated to the unclamped position, or detected to be in the clamped position.

Accordingly, while the present invention has been disclosed in connection with the preferred embodiments thereof, it should be understood that other embodiments may fall within the spirit and scope of the invention, as defined by the following claims.

The invention claimed is:

1. A rotatable substrate support comprising:
    a rotatable base;
    at least one moveable end effector coupled to rotate with the rotatable base and configured to selectively move between a clamped position wherein a properly positioned substrate is held in place by the end effector and an unclamped position wherein a substrate may be extracted from or received by the rotatable substrate support; and
    a sensing system having a first part coupled to the moveable end effector and a second part coupled to the rotatable base, the first part and the second part being positioned so that the sensing system detects when the moveable end effector is in an overclamp position.

2. The rotatable substrate support of claim 1 wherein a first one of the first part and the second part comprises an inductive sensor.

3. The rotatable substrate support of claim 2 wherein a second one of the first part and the second part comprises a flag, and further wherein the inductive sensor is configured to detect when the flag is within a predetermined distance from the inductive sensor.

4. The rotatable substrate support of claim 1 wherein a first one of the first part and the second part comprises a light emitter.

5. The rotatable substrate support of claim 4 wherein a second one of the first part and the second part comprises a light detector.

6. The rotatable substrate support of claim 1 wherein a first one of the first part and the second part comprises a light emitter and a detector.

7. The rotatable substrate support of claim 6 wherein a second one of the first part and the second part comprises a reflective surface, and further wherein the detector detects a beam of light reflected by the reflective surface when the moveable end effector is in the overclamp position.

8. The rotatable substrate support of claim 1 further comprising a controller coupled to the sensing system and configured to receive an overclamp signal output by the sensing system and to prevent processing when the overclamp signal is received.

9. The rotatable substrate support of claim 1 wherein the at least one moveable end effector comprises a plurality of moveable end effectors coupled to the rotatable base and configured to support a substrate and further comprising a plurality of sensing systems, one coupled to each of the moveable end effectors and configured to detect an overclamp condition thereof.

10. The rotatable substrate support of claim 1 wherein the sensing system detects when the moveable end effector is in an overclamp position by sensing that the moveable end effector is not in a clamped position or an unclamped position.

11. A substrate support comprising:
    a base;
    at least one moveable end effector coupled to the base and configured to selectively move between a clamped position wherein a properly positioned substrate is held in place by the moveable end effector and an unclamped position wherein a substrate may be extracted from or received by the substrate support; and
    a sensing system having a first part coupled to the moveable end effector and a second part coupled to the base, the first part and the second part being positioned so that the sensing system detects when the end effector is in an overclamp position.

12. The substrate support of claim 11 wherein the base is rotatable and further comprising a plurality of end effectors positioned to hold a disk shaped substrate on the base and wherein the sensing system detects when the moveable end effector is in an overclamp position by sensing that the moveable end effector is not in a clamped position or an unclamped position.

13. A substrate support comprising:
    a base;
    at least one end effector coupled to the base and configured to selectively move between a clamped position wherein a properly positioned substrate is held in place by the end effector and an unclamped position wherein a substrate may be extracted from or received by the substrate support; and
    a sensing system coupled to the base and configured to detect when the end effector is in an over clamp position.

14. The substrate support of claim 13 wherein the sensing system detects when the end effector is in an overclamp position by sensing that the end effector is not in a clamped position or an unclamped position.

15. A method comprising:
    providing a base;
    providing an end effector coupled to the base and configured to selectively move between a clamped position wherein a properly positioned substrate is held in place by the end effector and an unclamped position wherein a substrate may be extracted from or received by the rotatable substrate support; and
    detecting when the end effector is in an overclamp position.

16. The method of claim 15 wherein detecting when the end effector is in an overclamp position comprises:
    providing a flag;
    providing a sensor configured to detect when the flag is within a predetermined distance from the sensor; and
    monitoring the sensor to determine whether the flag is within a predetermined distance from the sensor.

17. The method of claim 16 further comprising:
    generating an alarm if the flag is within a predetermined distance from the sensor.

* * * * *